(12) United States Patent
Nakazawa

(10) Patent No.: US 8,642,409 B2
(45) Date of Patent: Feb. 4, 2014

(54) SEMICONDUCTOR DEVICE AND METHOD OF MANUFACTURING THE SAME

(75) Inventor: Keisuke Nakazawa, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 31 days.

(21) Appl. No.: 13/424,071

(22) Filed: Mar. 19, 2012

(65) Prior Publication Data

US 2013/0043563 A1 Feb. 21, 2013

(30) Foreign Application Priority Data

Aug. 19, 2011 (JP) ................... 2011-179474

(51) Int. Cl.
*H01L 21/00* (2006.01)
*H01L 21/84* (2006.01)
*H01L 21/336* (2006.01)

(52) U.S. Cl.
USPC ........... 438/157; 438/263; 438/781; 438/786; 257/E21.413

(58) Field of Classification Search
USPC ................................. 438/157, 283
See application file for complete search history.

(56) References Cited

U.S. PATENT DOCUMENTS

| | | | |
|---|---|---|---|
| 7,407,864 B2 | 8/2008 | Kawasaki et al. | |
| 7,521,318 B2 | 4/2009 | Ueno | |
| 8,080,463 B2 | 12/2011 | Iwasawa et al. | |
| 2008/0121972 A1* | 5/2008 | Shiozawa et al. | 257/316 |
| 2010/0311220 A1 | 12/2010 | Matsuo et al. | |
| 2012/0034754 A1 | 2/2012 | Iwasawa et al. | |

FOREIGN PATENT DOCUMENTS

| | | |
|---|---|---|
| JP | 2001-135718 | 5/2001 |
| JP | 2007-287810 | 11/2007 |
| JP | 2010-166026 | 7/2010 |

OTHER PUBLICATIONS

Nakazawa; "Semiconductor Device and Method of Manufacturing Semiconductor Device", U.S. Appl. No. 13/309,730, Filed Dec. 2, 2011.

* cited by examiner

*Primary Examiner* — Michelle Mandala
*Assistant Examiner* — Shaka White
(74) *Attorney, Agent, or Firm* — Finnegan, Henderson, Farabow, Garrett & Dunner, LLP

(57) ABSTRACT

According to one embodiment, there is provided a method of manufacturing a semiconductor device. In the method, a substrate portion and a fin portion on the substrate portion are formed. A first silicon oxide film is formed on each side surface of the fin portion. A polysilazane film having an upper surface lower than the upper surface of the first silicon oxide film is formed on each side surface of the first silicon oxide film. The polysilazane film is converted into a silicon oxynitride film. The first silicon oxide film is etched to make the upper surface of the first silicon oxide film not higher than the upper surface of the silicon oxynitride film. A heavily doped semiconductor layer is formed in the fin portion.

13 Claims, 18 Drawing Sheets

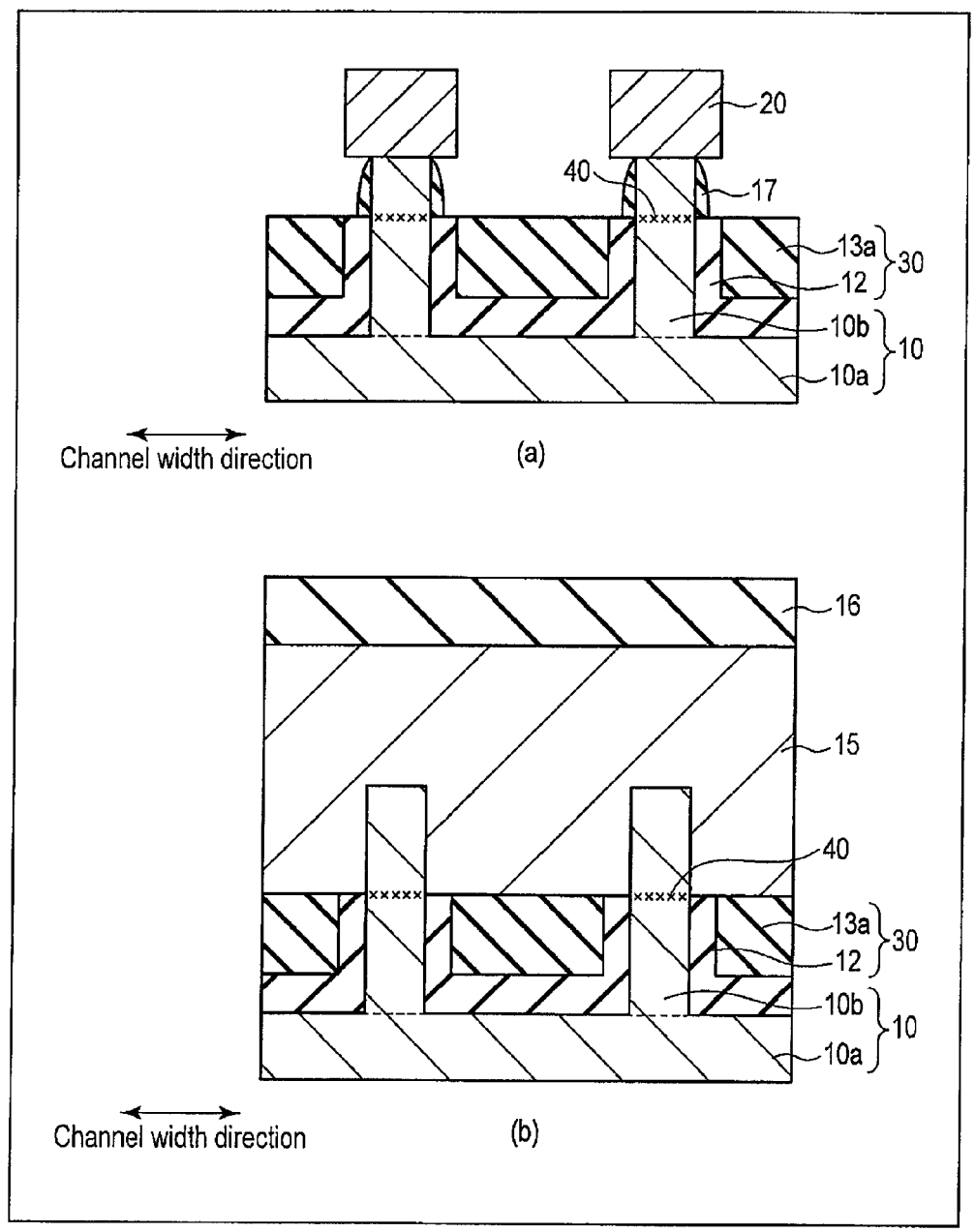
F I G. 2

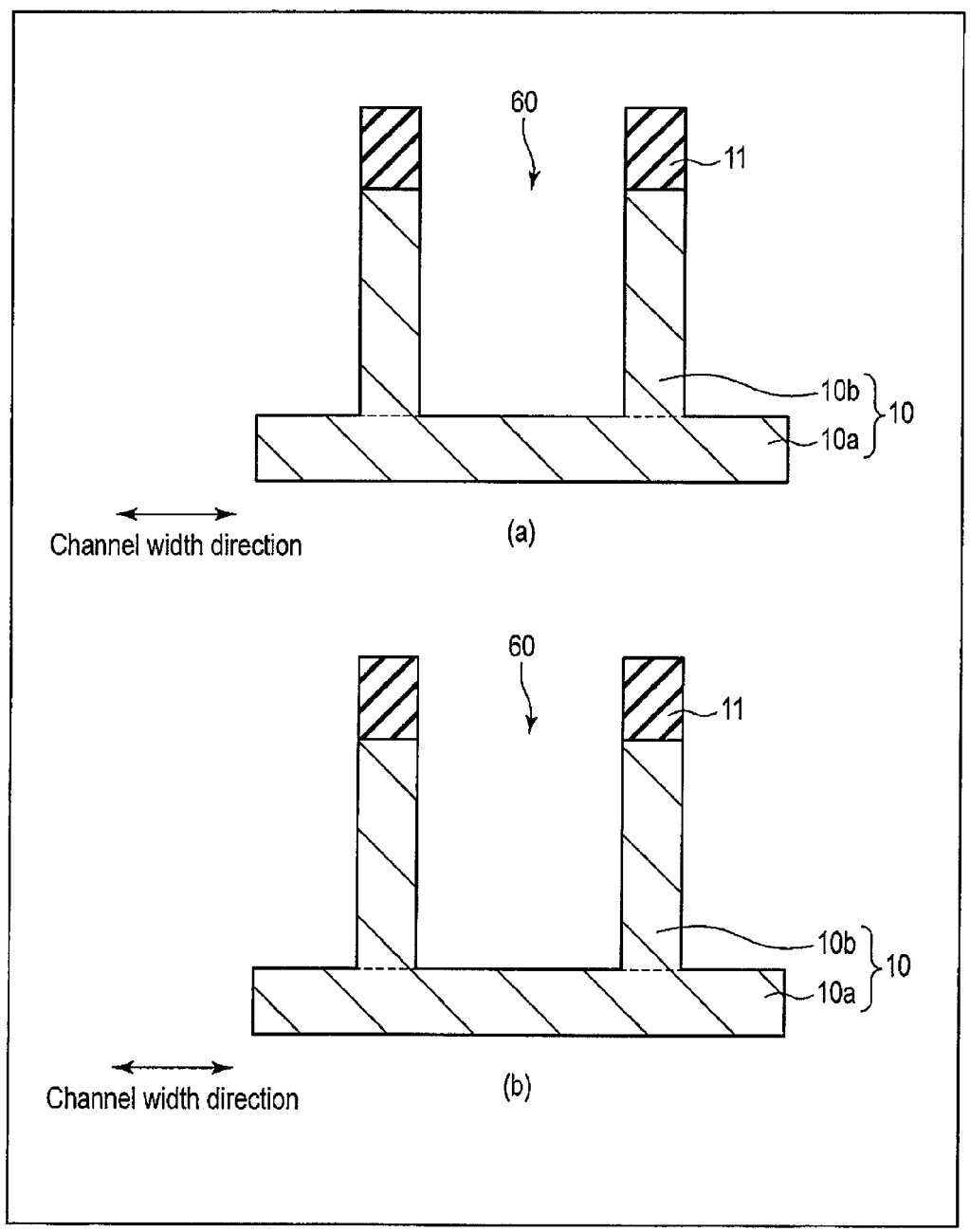
F I G. 3

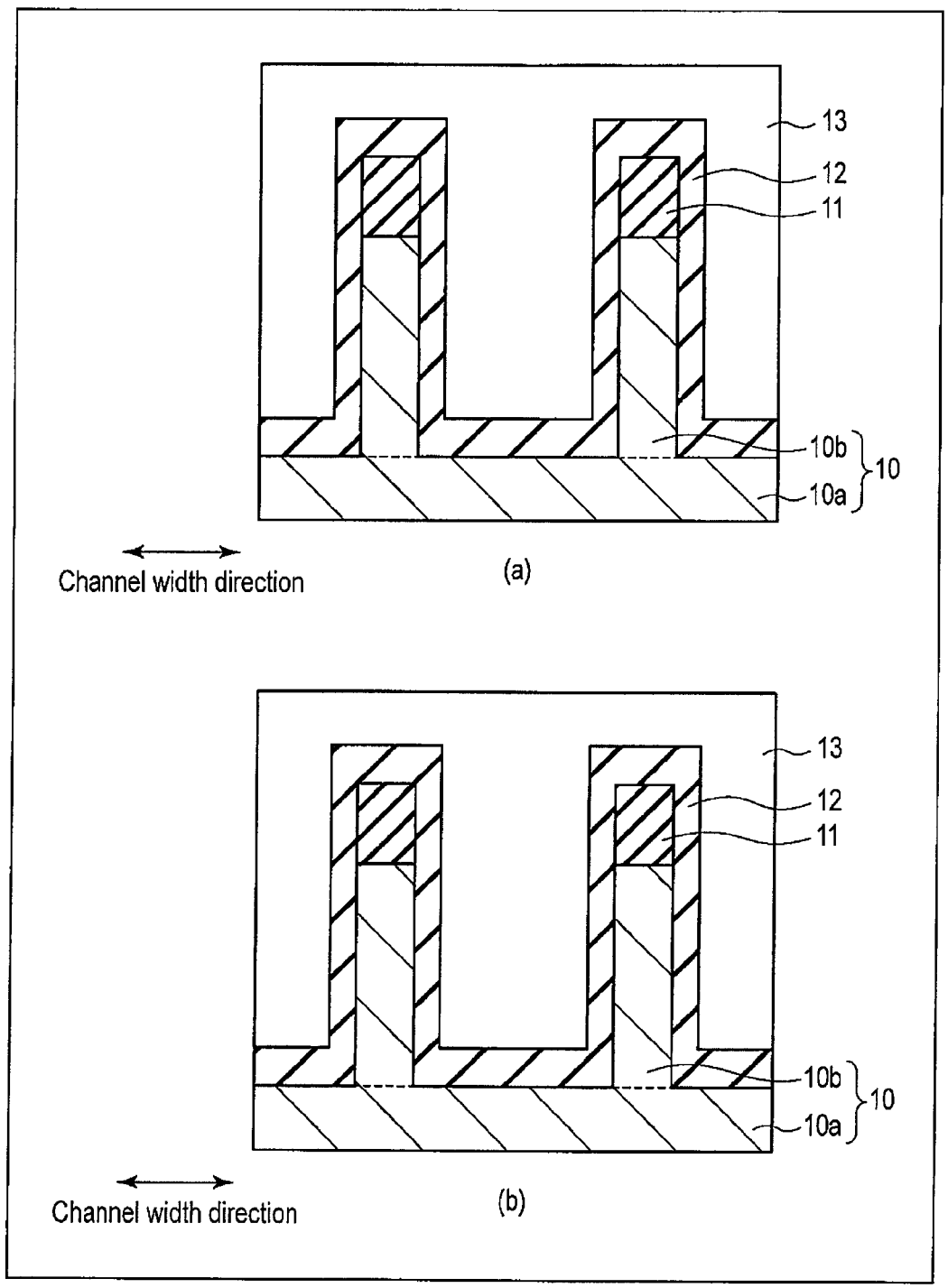
F I G. 4

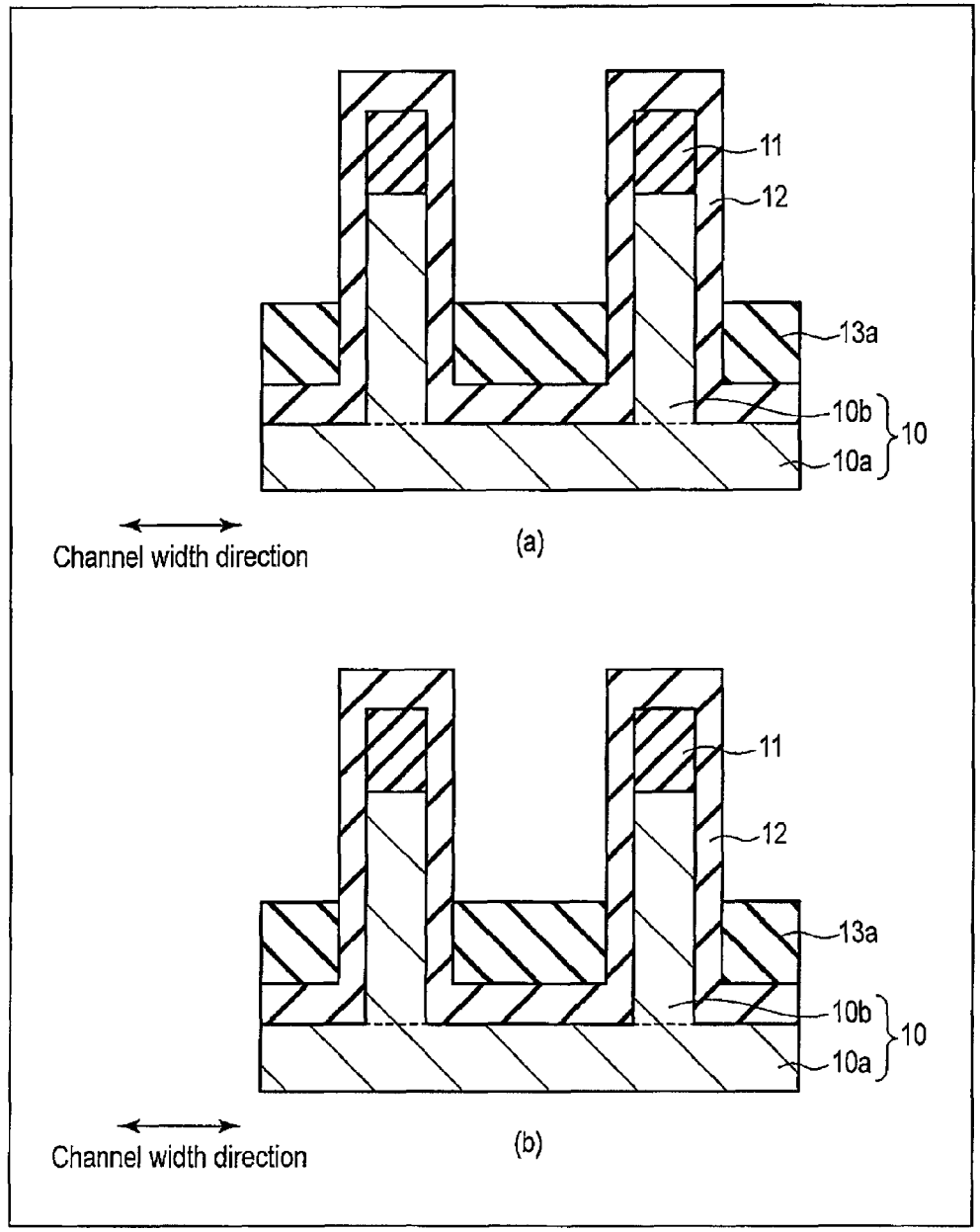
F I G. 6

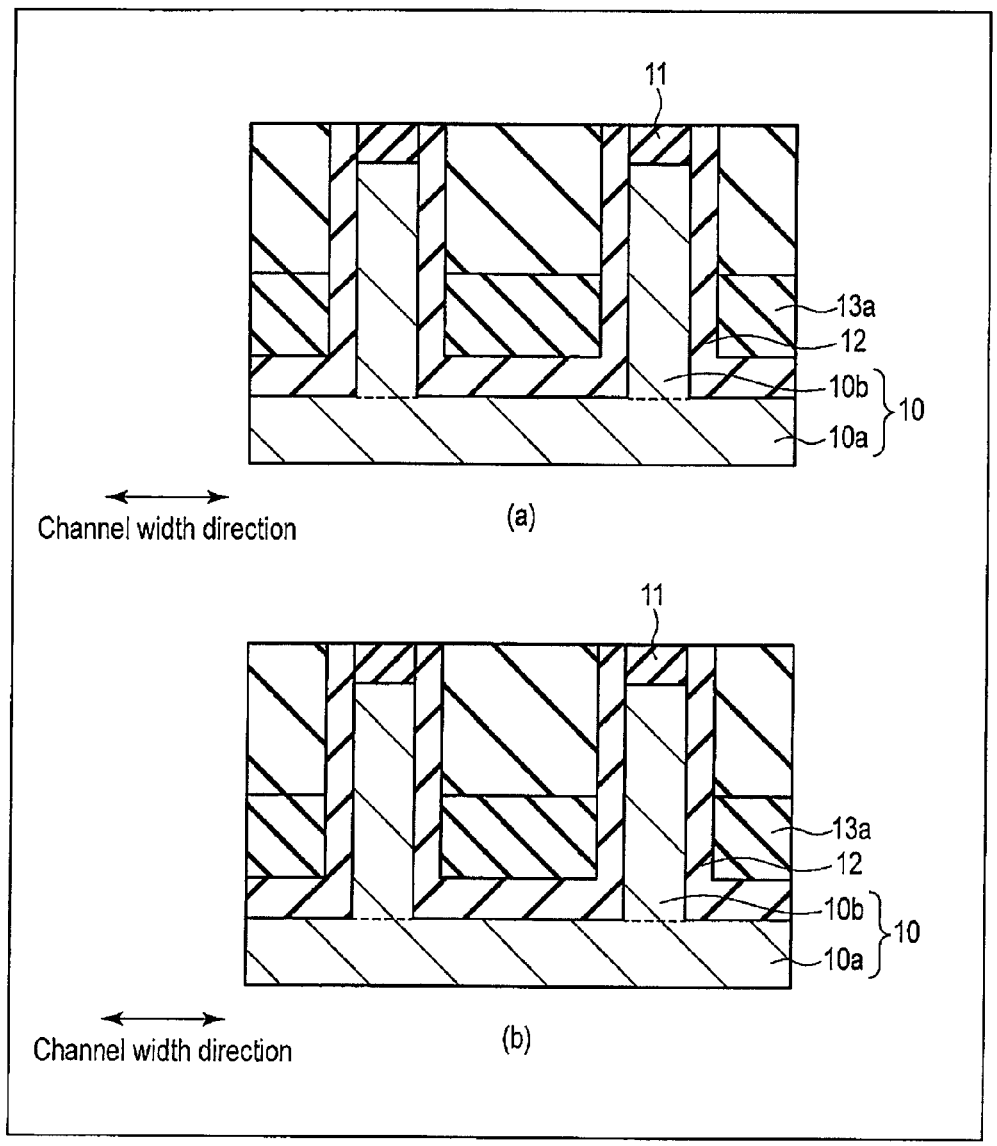
F I G. 8

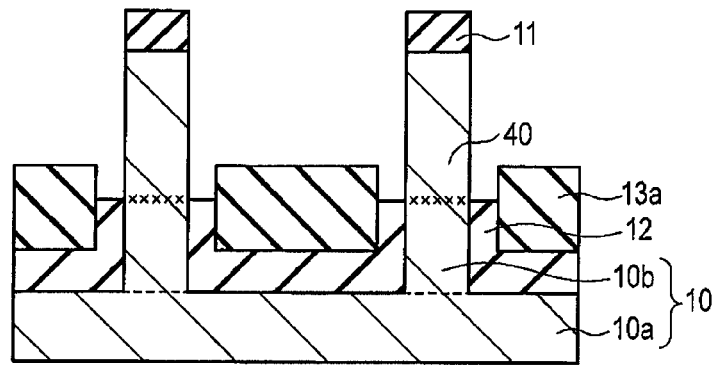
Channel width direction
F I G. 10
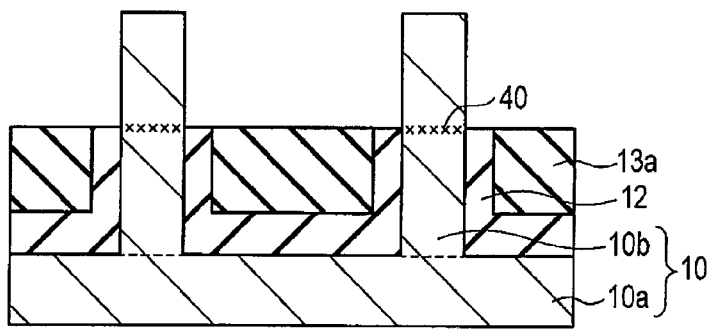
(a)
Channel width direction
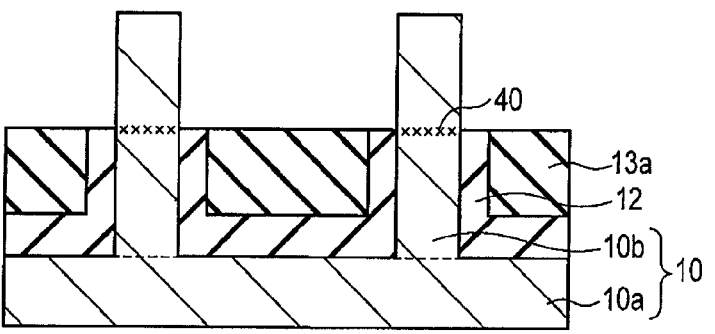
(b)
Channel width direction
F I G. 11

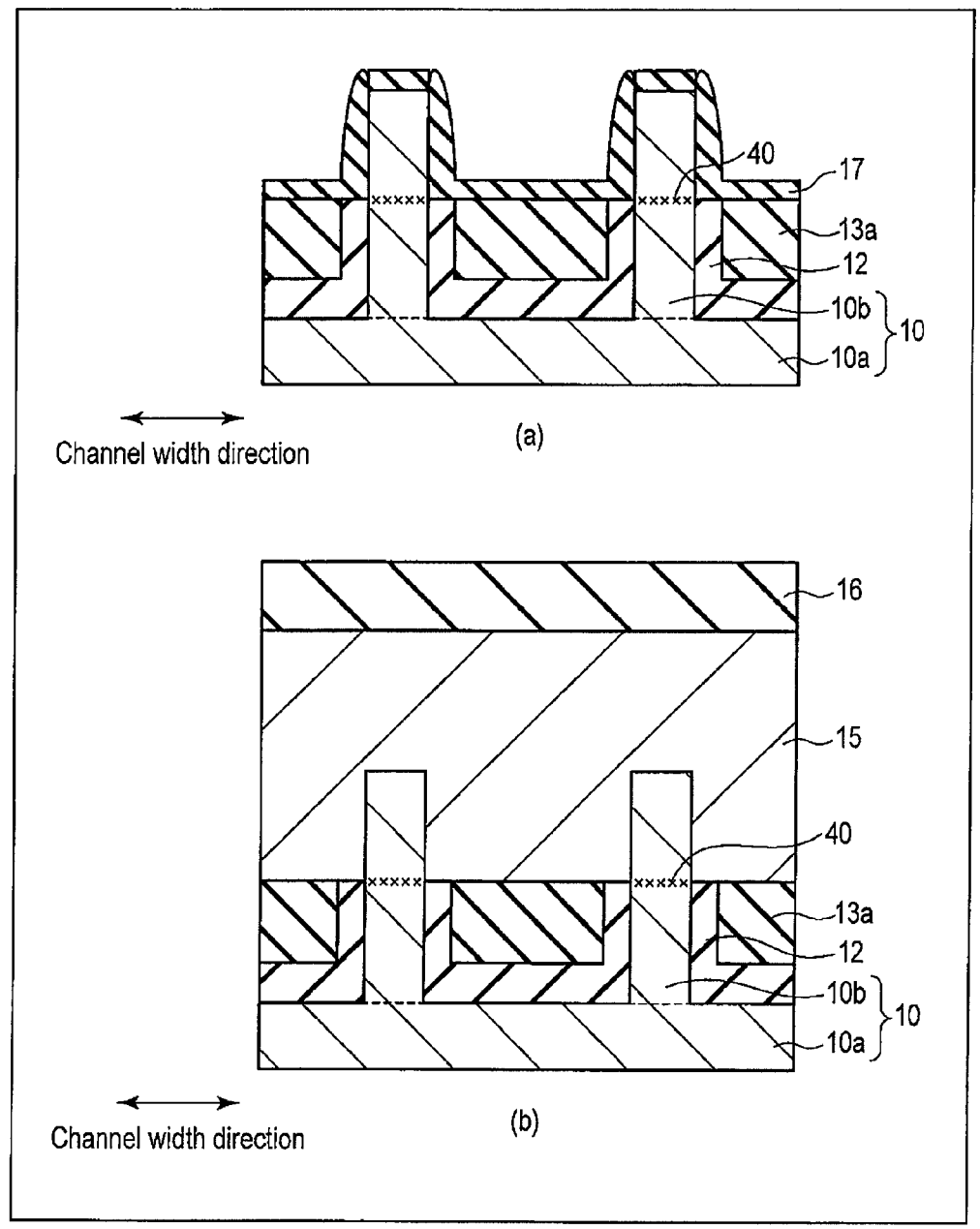
F I G. 14

Channel width direction (a)

Channel width direction (b)

US 8,642,409 B2

SEMICONDUCTOR DEVICE AND METHOD OF MANUFACTURING THE SAME

CROSS-REFERENCE TO RELATED APPLICATIONS

This application is based upon and claims the benefit of priority from prior Japanese Patent Application No. 2011-179474, filed Aug. 19, 2011, the entire contents of which are incorporated herein by reference.

FIELD

Embodiments described herein relate generally to a semiconductor device and a method of manufacturing the same.

BACKGROUND

For a recent semiconductor device, a Fin-FET (Field Effect Transistor) has been proposed as a new transistor structure to attain power saving and speed-up. The Fin-FET includes a substrate portion and a fin portion formed by patterning a semiconductor substrate (for example, Si substrate). A gate electrode is formed on the side and upper surfaces of the fin portion, thereby forming a channel in the fin portion.

When the transistor structure is changed from a conventional planar FET to the Fin-FET, the device performance can be improved. On the other hand, the semiconductor manufacturing process becomes complex because the structure changes from a 2D structure to a 3D structure. In addition, as the wiring pattern size decreases, the manufacturing process becomes more complex.

In the Fin-FET, especially, burying an STI (Shallow Trench Isolation) becomes more difficult along with the pattern size reduction. In the conventional CVD, for example, when the trench width of the STI is 70 to 100 nm or less, a gap is formed in the STI, and complete burying is impossible.

There has been devised a method of burying PSZ (polysilazane) having excellent burying properties as an STI using an application method. PSZ is a polymer with a basic structure —$SiH_2$—NH— and is converted into silicon dioxide ($SiO_2$) upon annealing in a steam atmosphere.

At this time, when the steam temperature is high, PSZ attains characteristics similar to those of $SiO_2$. Simultaneously, however, the side walls of the fin portion made of Si oxidize. On the other hand, when the steam temperature is low, conversion of PSZ to $SiO_2$ is weaker although oxidation of the side walls of the fin portion is suppressed. In this case, $SiO_2$ converted from PSZ is etched faster by an etchant. That is, since the etching rate of $SiO_2$ converted from PSZ is higher than that of the $SiO_2$ film liner formed on the surface of the fin portion, steps are formed in the STI structure.

As described above, in the conventional method of burying the STI using PSZ, it is difficult to obtain a desired STI shape. For this reason, a problem arises even in, for example, the process of manufacturing a punch-through stopper later, resulting in degradation of the device characteristics of the Fin-FET.

BRIEF DESCRIPTION OF THE DRAWINGS

FIG. 2 is sectional views showing the structure of the Fin-FET according to the embodiment;

FIG. 3 is sectional views showing a step in the manufacture of the Fin-FET according to the embodiment;

FIGS. 4, 5, 6, 7, 8, 9, 10, 11, 12, 13, 14, 15, 16, and 17 are sectional views showing steps in the manufacture of the Fin-FET according to the embodiment;

DETAILED DESCRIPTION

Figure 1:
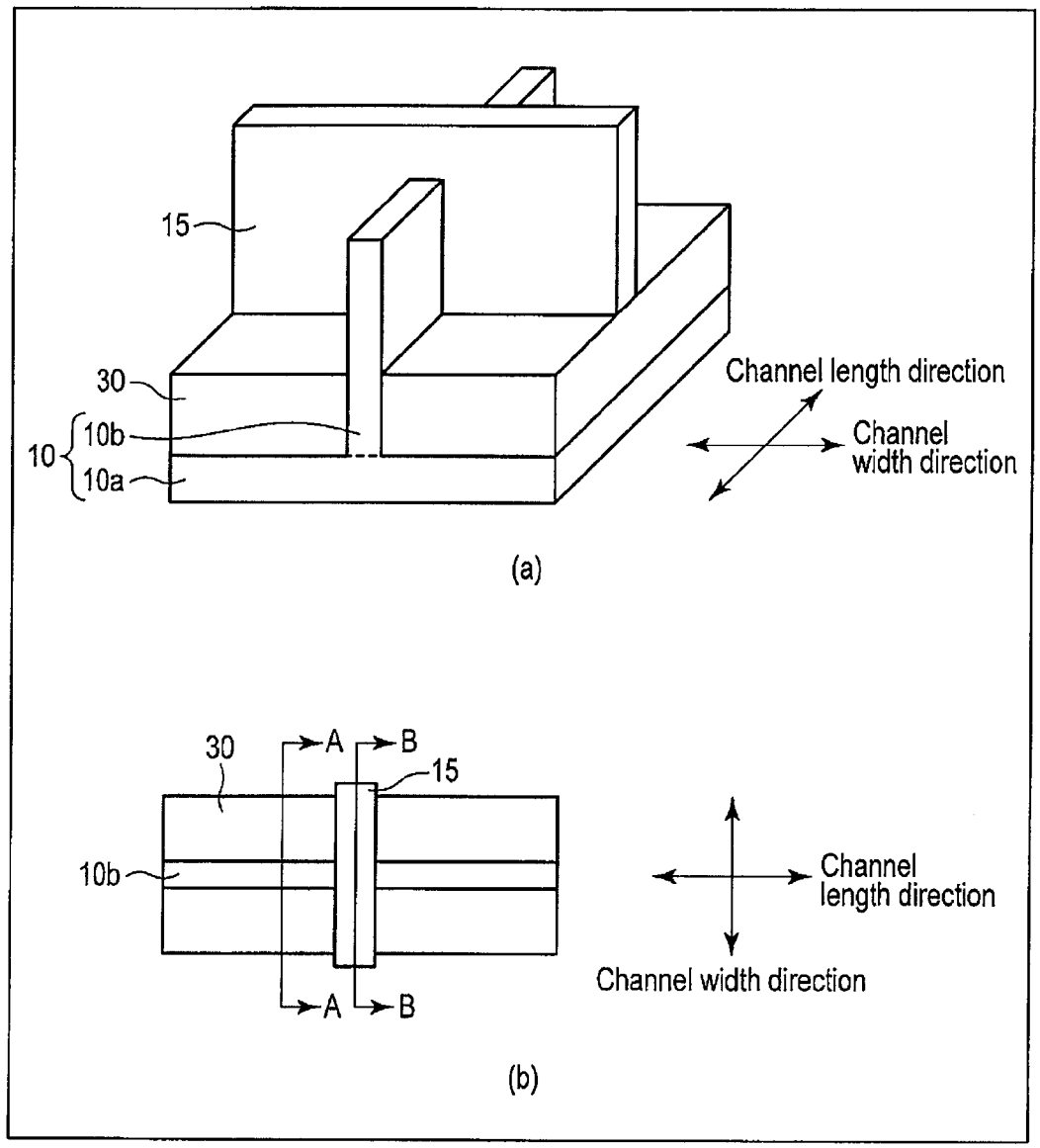
FIG. 1 is views showing an example of the arrangement of a Fin-FET according to the embodiment.
Figure 5:
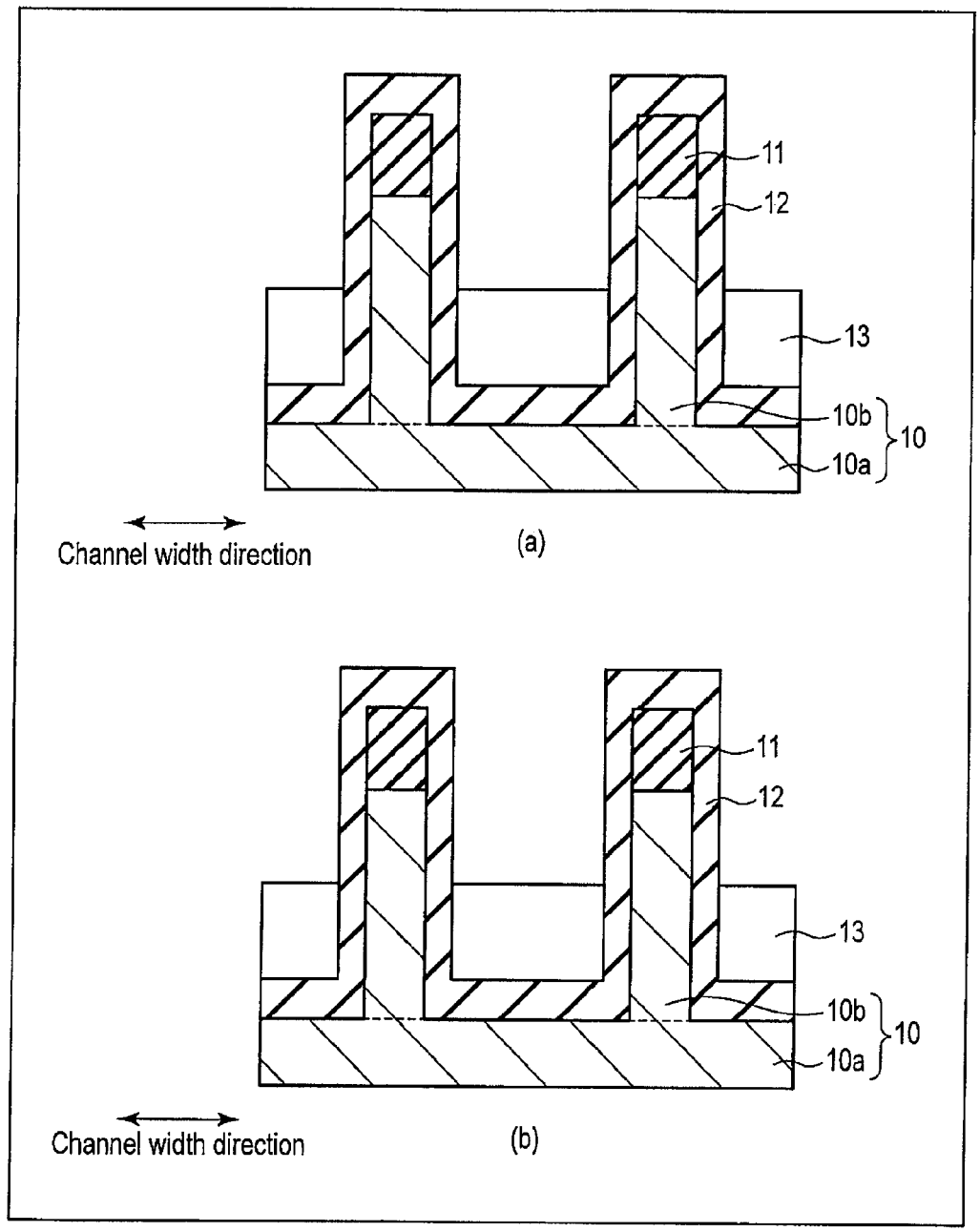
Figure 7:
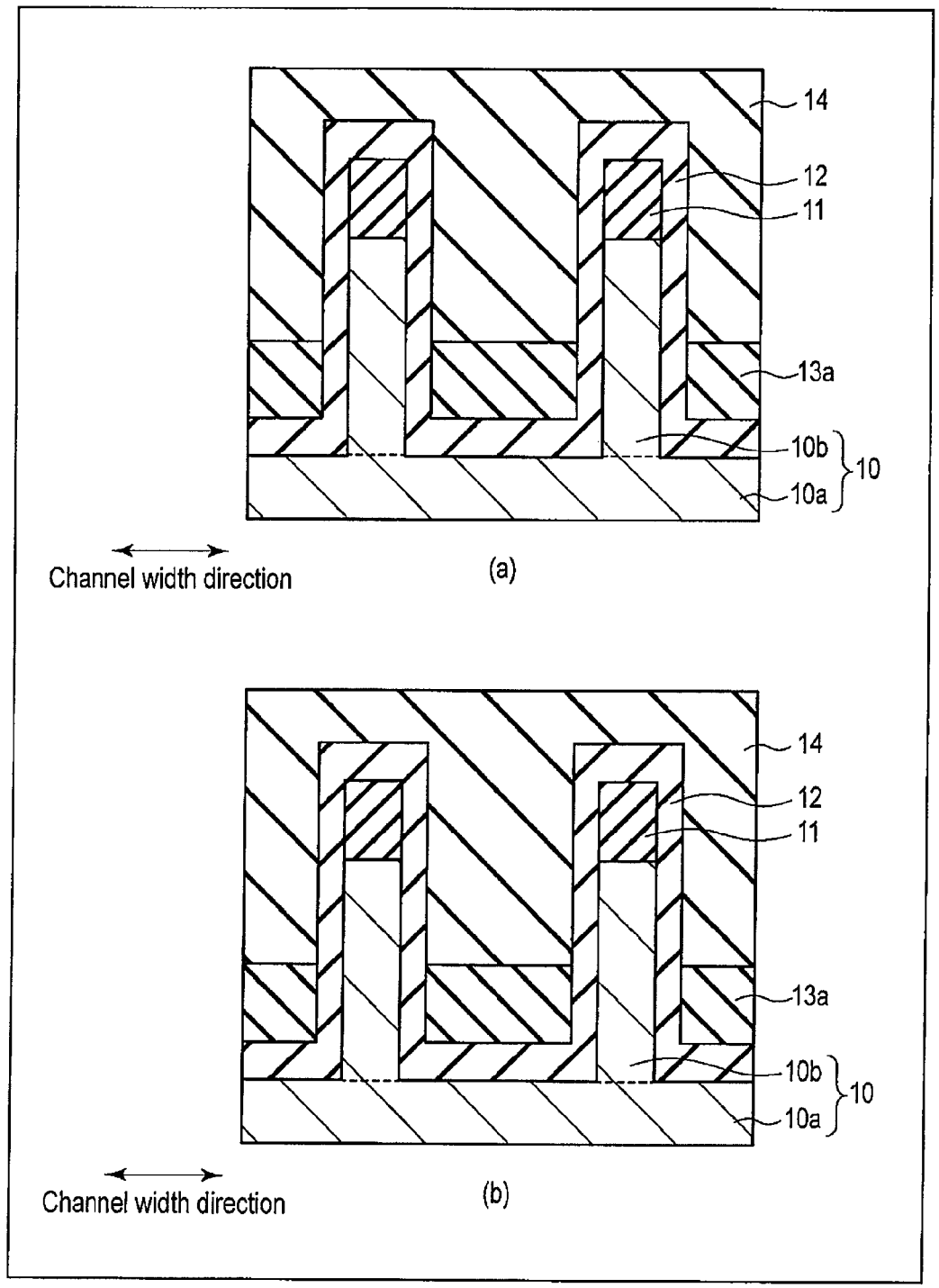
Figure 9:
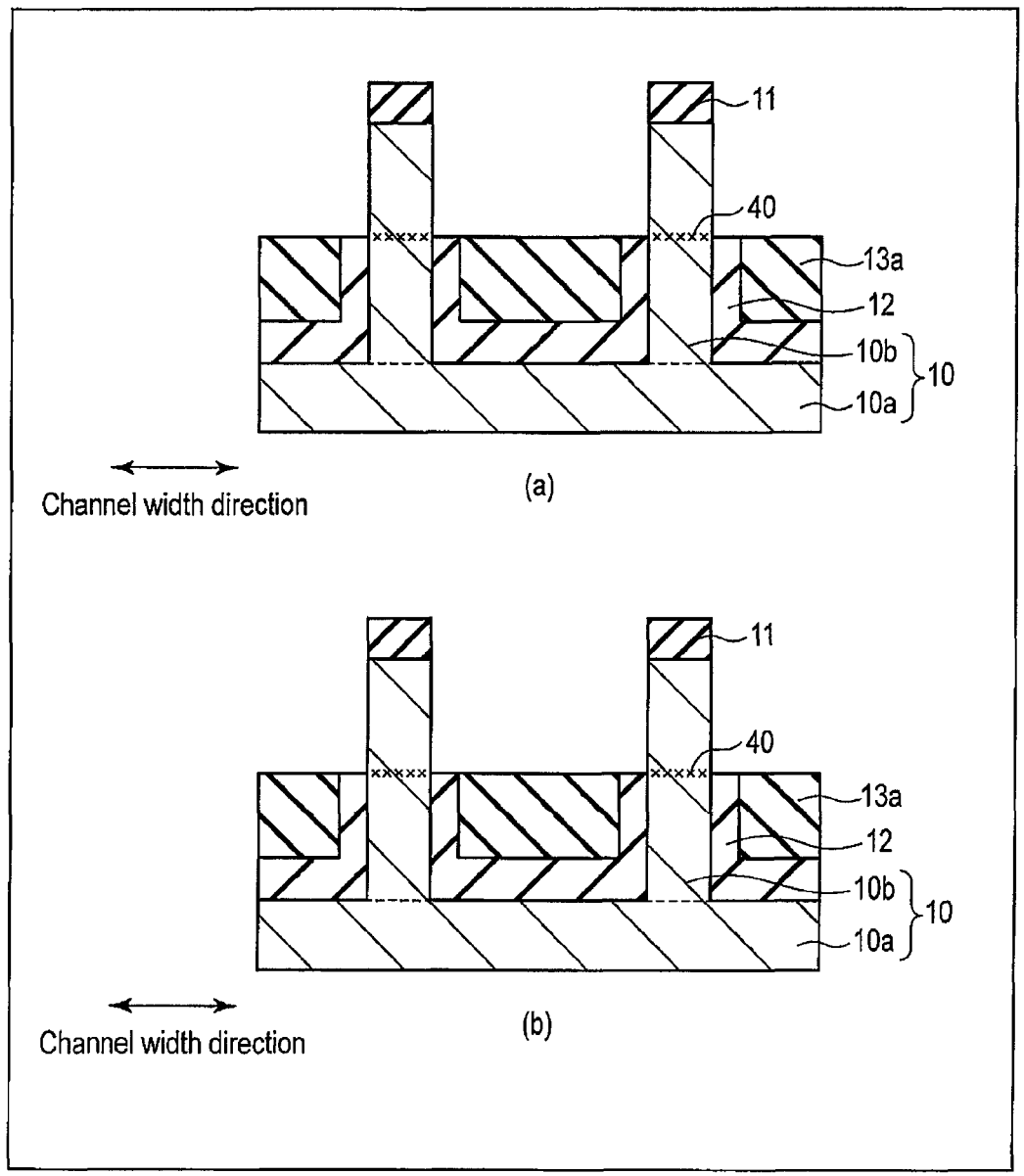
Figure 12:
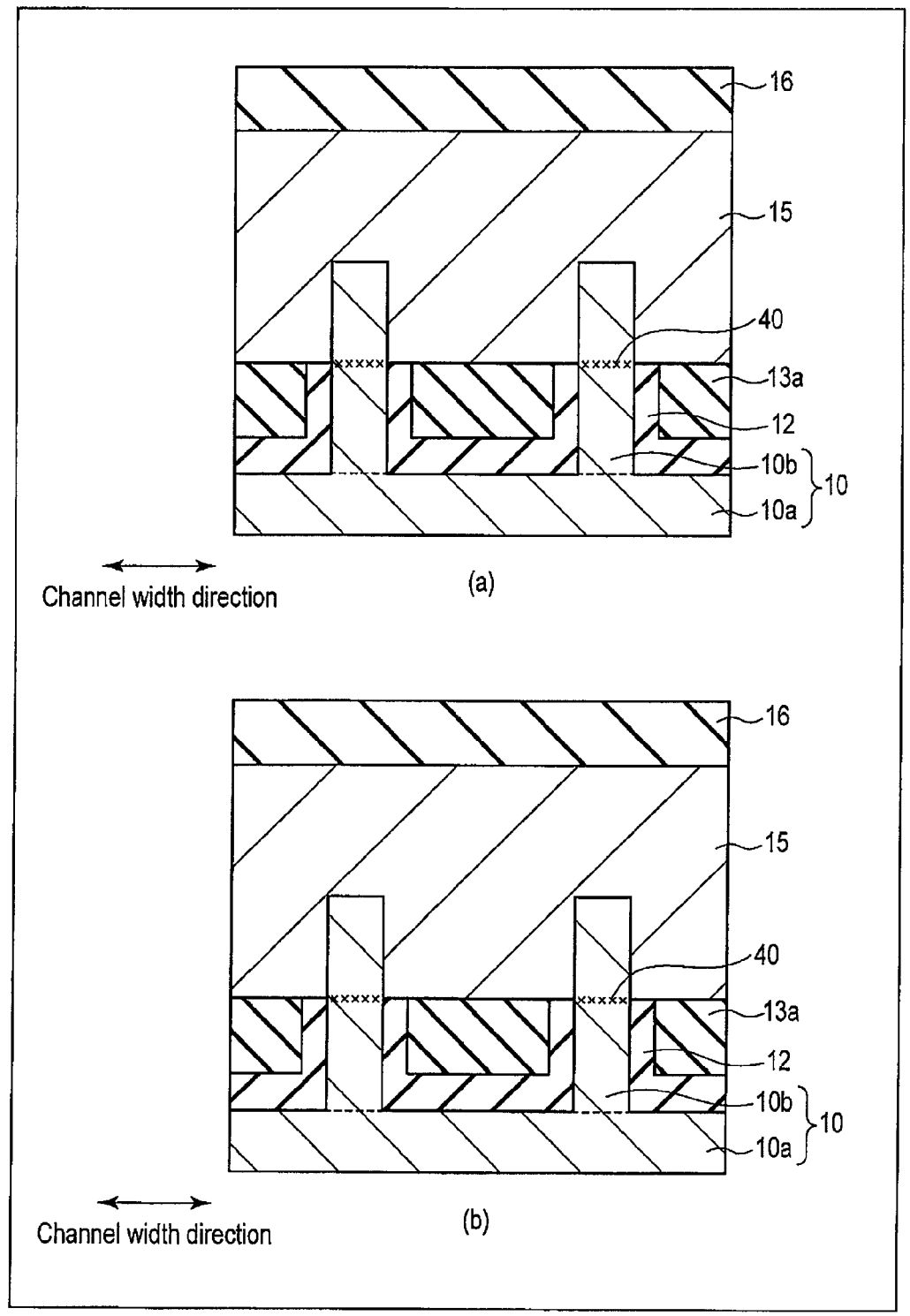
Figure 13:
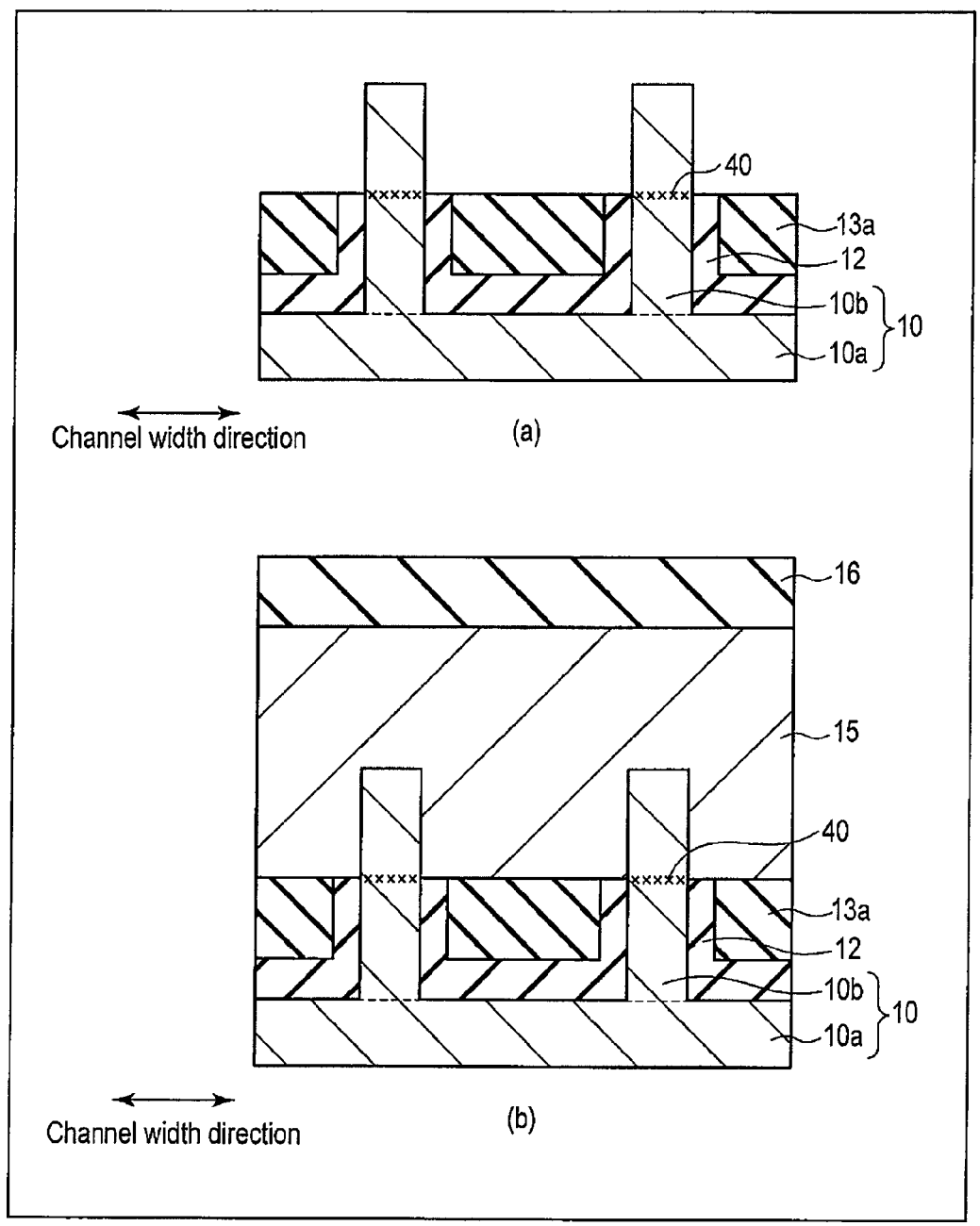
Figure 15:
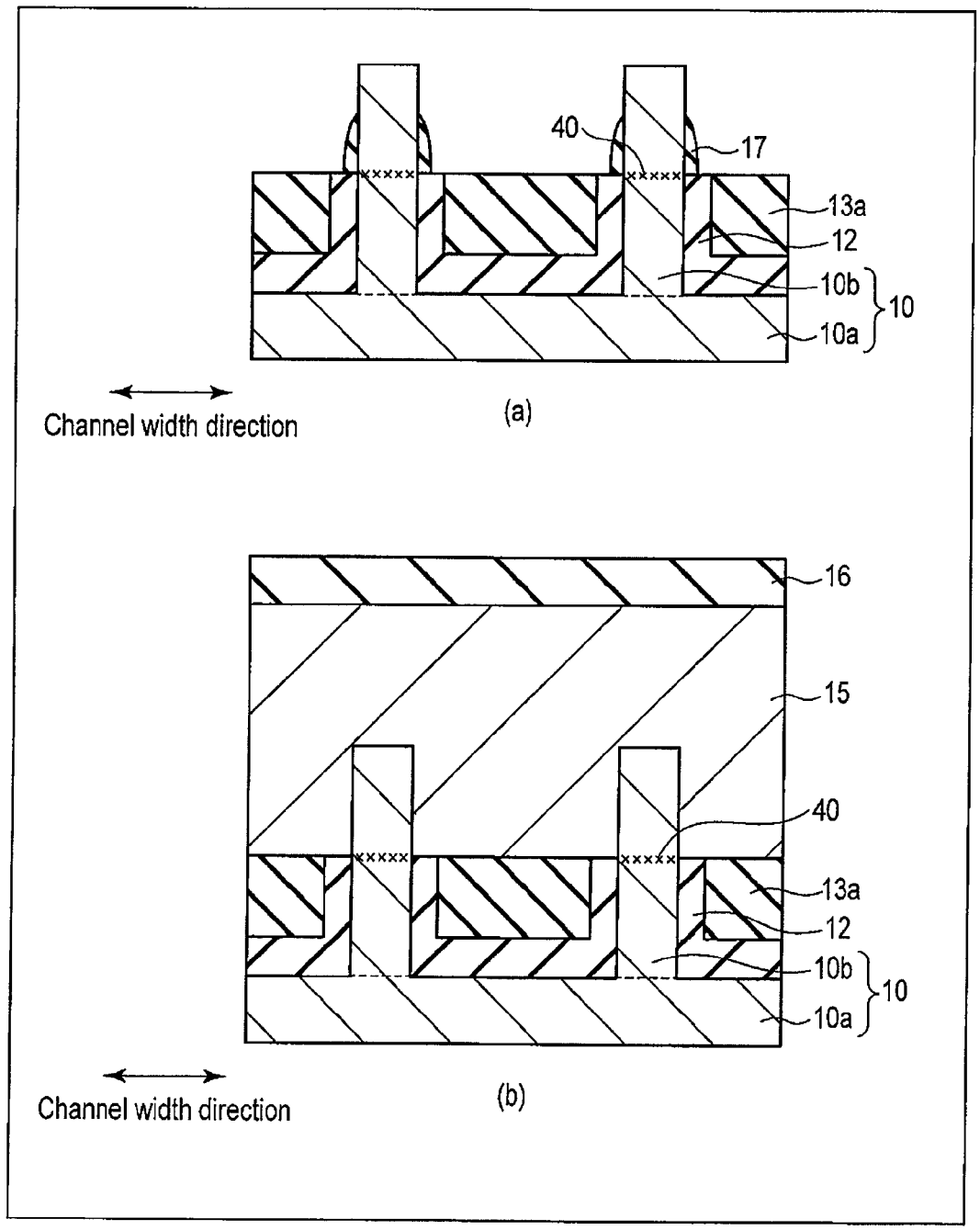
Figure 16:
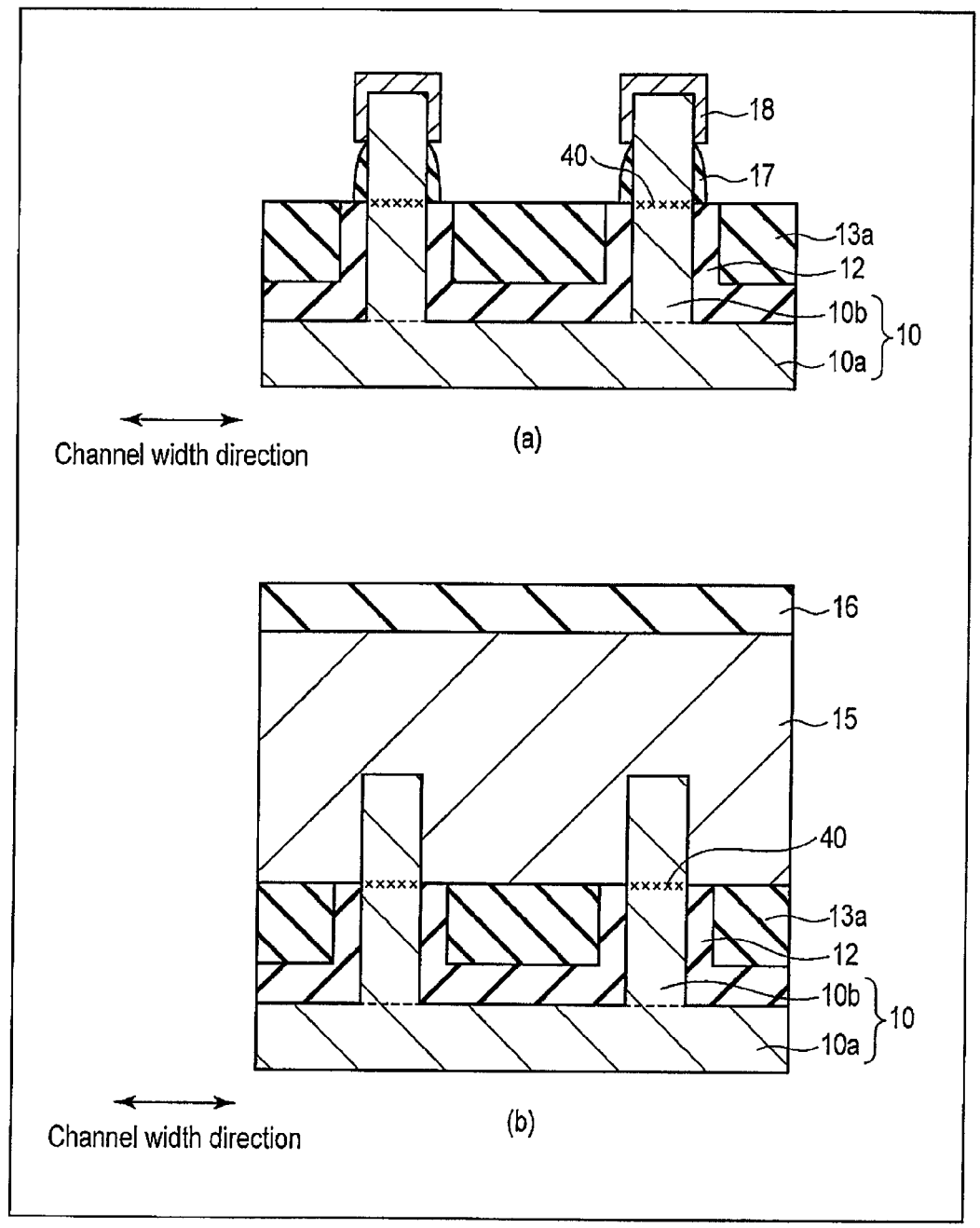
Figure 17:
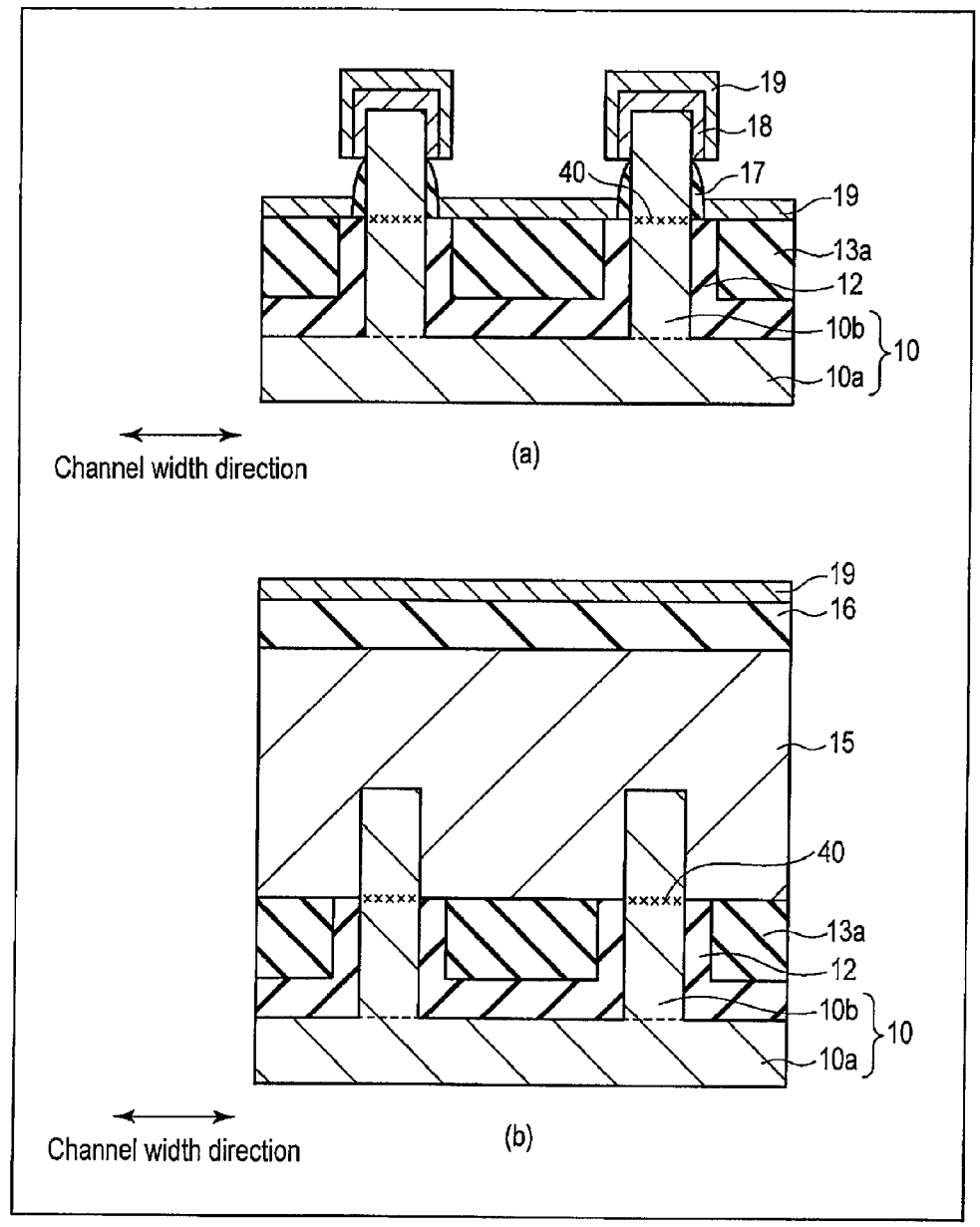

In general, according to one embodiment, there is provided a method of manufacturing a semiconductor device. In the method of manufacturing the semiconductor device, a substrate portion and a fin portion on the substrate portion are formed in a semiconductor substrate. A first silicon oxide film is formed on each side surface of the fin portion. A polysilazane film having an upper surface lower than the upper surface of the first silicon oxide film is formed on each side surface of the first silicon oxide film. The polysilazane film is converted into a silicon oxynitride film by nitriding and oxidizing the polysilazane film. A second silicon oxide film is formed on an entire surface to cover the fin portion. The first silicon oxide film and the second silicon oxide film are etched to make the upper surface of the first silicon oxide film not higher than the upper surface of the silicon oxynitride film. A heavily doped semiconductor layer is formed in the fin portion.

The embodiment will now be described with reference to the accompanying drawing. The same reference numerals denote the same parts throughout the drawing. A repetitive description will be done as needed.

<Fin-FET>

An example of the arrangement of a semiconductor device (Fin-FET) according to the embodiment will be described with reference to FIG. 1.

FIG. 1 is views showing an example of the arrangement of the Fin-FET according to the embodiment. More specifically, FIG. 1(*a*) is a perspective view showing an example of the arrangement of the Fin-FET according to the embodiment. FIG. 1(*b*) is a plan view showing an example of the arrangement of the Fin-FET according to the embodiment.

As shown in FIGS. 1(*a*) and 1(*b*), the Fin-FET includes a semiconductor substrate 10, a gate electrode 15, and an STI 30.

The semiconductor substrate (Si substrate) 10 is formed from a flat plate-like substrate portion 10*a*, and a projecting portion (fin portion) 10*b* provided on the substrate portion 10*a* and patterned along the channel length direction. The fin portion 10*b* is provided in the element region (active area) on the substrate portion 10*a*. A source and a drain are formed in the fin portion 10*b*, and a channel is formed between them.

The gate electrode 15 is formed along the channel width direction so as to intersect the fin portion 10*b* and cover its side and upper surfaces. The channel is formed in the fin portion 10*b* at the position intersecting the gate electrode 15. A gate insulating film (not shown) is formed between the gate electrode 15 and the fin portion 10*b*.

The STI 30 is formed as an element isolation on the lower side surfaces of the fin portion 10*b*. In other words, the STI 30 is formed on the substrate portion 10*a* between two fin portions 10*b* adjacent in the channel width direction.

Embodiment

The Fin-FET according to the embodiment will be described with reference to FIGS. 2, 3, 4, 5, 6, 7, 8, 9, 10, 11, 12, 13, 14, 15, 16, and 17. In the Fin-FET according to this embodiment, as the STI 30, an $SiO_2$ film liner 12 is formed on the surface of the fin portion 10b. After that, a PSZ film 13 is buried by an application method and nitrided and oxidized to form an SiON film 13a. This allows to control the etching selectivity of the $SiO_2$ film liner 12 and the SiON film 13a and form a desired STI structure. The Fin-FET according to the embodiment will be described below in detail.

[Structure]

The structure of the Fin-FET according to the embodiment will be described first with reference to FIG. 2.

FIG. 2 are sectional views showing the structure of the Fin-FET according to the embodiment. More specifically, FIG. 2(a) is a sectional view of the source/drain regions taken along a line A-A in FIG. 1(b). FIG. 2(b) is a sectional view of the channel region taken along a line B-B in FIG. 1(b).

As shown in FIG. 2(a), in the section of the source/drain regions, the Fin-FET includes the semiconductor substrate 10, the STI 30, an SiN film liner (silicon nitride film) 17, and a silicide film (FUSI: Full Silicide) 20.

The semiconductor substrate 10 is formed from, for example, a p-type Si substrate. The semiconductor substrate 10 includes the substrate portion 10a and the fin portions 10b. A region on the substrate portion 10a where each fin portion 10b is formed is the element region. The height of the fin portion 10b (the depth of a trench 60 to be described later) is, for example, about 100 to 300 nm. The width of the fin portion 10b in the channel width direction is, for example, 100 nm or less, and preferably, 50 nm or less.

A heavily doped semiconductor layer 40 functioning as a punch-through stopper is formed in the fin portions 10b. The heavily doped semiconductor layer 40 is formed to be almost flush with the upper surface of the STI 30 (the upper surface of the $SiO_2$ film liner 12 formed on each side surface of the fin portion 10b) to be described later.

The STI 30 is formed between the two adjacent fin portions 10b to insulate and isolate them from each other. Details of the STI 30 will be described later.

The SiN film liner 17 is formed on each upper side surface of the fin portion 10b. The film thickness of the SiN film liner 17 is, for example, 2 to 30 nm.

The silicide film 20 is formed on the upper surface of the fin portion 10b. The width of the silicide film 20 in the channel width direction is larger than that of the fin portion 10b. Forming the silicide film 20 makes it possible to reduce the resistance of the electrode. Note that the silicide film 20 is made of, for example, Ni silicide or Co silicide. The silicide film 20 is formed by, for example, a salicide process.

In this embodiment, the STI 30 includes the $SiO_2$ film liner (silicon oxide film) 12 and the SiON film (silicon oxynitride film) 13a.

The $SiO_2$ film liner 12 is formed on the upper surface of the substrate portion 10a and each lower side surface of the fin portion 10b. In other words, the $SiO_2$ film liner 12 is formed on the surface of the semiconductor substrate 10 in each element isolation region. Forming the $SiO_2$ film liner 12 allows to prevent oxidation and crack of the fin portion made of Si. The film thickness of the $SiO_2$ film liner 12 is, for example, 2 to 30 nm. The SiN film liner 17 is formed on the upper surface of the $SiO_2$ film liner 12 formed on each side surface of the fin portion 10b.

The SiON film 13a is formed on the side surfaces of the $SiO_2$ film liner 12 formed on the side surfaces of the fin portions 10b, and the upper surface of the $SiO_2$ film liner 12 formed on the upper surface of the substrate portion 10a. In other words, the SiON film 13a is formed to bury the lower side of the trench 60 to be described later and have the side and lower surfaces covered with the $SiO_2$ film liner 12. The upper surface of the SiON film 13a is flush with or higher than the upper surface of the $SiO_2$ film liner 12 formed on each side surface of the fin portion 10b. That is, at least the lower side of the SiON film 13a is surrounded by the $SiO_2$ film liner 12. The concentration of nitrogen atoms in the SiON film 13a is preferably $10^{20}$ atoms/cm$^3$ or more.

As shown in FIG. 2(b), in the section of the channel region, the Fin-FET includes the semiconductor substrate 10, the STI 30, and the gate electrode 15.

In the channel region, the semiconductor substrate 10 and the STI 30 have the same structures as in the source/drain regions. That is, the semiconductor substrate 10 includes the substrate portion 10a and the fin portions 10b. The STI 30 is formed between the two adjacent fin portions 10b. The STI 30 includes the $SiO_2$ film liner 12 and the SiON film 13a.

In the channel region, the gate electrode 15 is formed to intersect each fin portion 10b and cover the side and upper surfaces of the fin portion 10b. In other words, a channel is formed in the fin portion 10b at the position intersecting the gate electrode 15. A gate insulating film (not shown) is formed between the gate electrode 15 and the fin portion 10b. An SiN film 16 is formed on the gate electrode 15.

[Manufacturing Method]

A method of manufacturing the Fin-FET according to the embodiment will be described next with reference to 3, 4, 5, 6, 7, 8, 9, 10, 11, 12, 13, 14, 15, 16, 17, and 18.

FIGS. 3, 4, 5, 6, 7, 8, 9, 10, 11, 12, 13, 14, 15, 16, and 17 are sectional views showing steps in the manufacture of the Fin-FET according to the embodiment. More specifically, FIGS. 3(a), 4(a), 5(a), 6(a), 7(a), 8(a), 9(a), 11(a), 12(a), 13(a), 14(a), 15(a), 16(a), and 17(a) are sectional views of the source/drain regions taken along the line A-A in FIG. 1(b). FIGS. 3(b), 4(b), 5(b), 6(b), 7(b), 8(b), 9(b), 11(b), 12(b), 13(b), 14(b), 15(b), 16(b), and 17(b) are sectional views of the channel region taken along the line B-B in FIG. 1(b).

First, as shown in FIGS. 3(a) and 3(b), the surface of a semiconductor substrate 10 is heated in an oxidizing atmosphere to form an $SiO_2$ film (not shown) on the semiconductor substrate 10. The film thickness of the $SiO_2$ film is, for example, about 1 nm. After that, an SiN film 11 serving as a mask is formed on the $SiO_2$ film by an existing method such as sputtering or CVD (Chemical Vapor Deposition). The film thickness of the SiN film 11 is, for example, about 50 nm.

Next, the SiN film 11 and the semiconductor substrate 10 are processed by, for example, lithography and dry etching. At this time, the etching amount (depth) of the semiconductor substrate 10 is, for example, about 100 to 300 nm, and the width is 50 nm or less. A trench 60 for the STI 30 is thus formed in the semiconductor substrate 10. That is, a substrate portion 10a and fin portions 10b on the substrate portion 10a are formed in the semiconductor substrate 10.

Next, as shown in FIGS. 4(a) and 4(b), an $SiO_2$ film liner 12 is formed on the surface of the semiconductor substrate 10 and the surface of the SiN film 11 by, for example, CVD or thermal oxidation. In other words, the $SiO_2$ film liner 12 is formed on the upper surface of the substrate portion 10a, the side surfaces of the fin portion 10b, and the side and upper surfaces of the SiN film 11. The film thickness of the $SiO_2$ film liner 12 is, for example, about 2 to 30 nm. Forming the $SiO_2$ film liner 12 allows to prevent oxidation and crack of the fin portion 10b made of Si in the subsequent processes.

Next, a PSZ film 13 is formed on the $SiO_2$ film liner 12 by an application method using a spin coater. That is, the PSZ film 13 is formed on the upper surface of the $SiO_2$ film liner 12 formed on the upper surface of the substrate portion 10a, the side surfaces of the $SiO_2$ film liner 12 formed on the side surfaces of the fin portion 10b, and the upper and side surfaces of the SiO$_2$ film liner 12 formed on the side and upper surfaces of the SiN film 11. The trench 60 is thus filled with the PSZ film 13.

After that, the PSZ film 13 is baked to remove the solvent (to be referred to as the PSZ baked film 13 hereinafter). The baking temperature is about 80° C. to 300° C. The baking time is several ten sec. The PSZ baked film 13 is so thick that it completely buries the Si pattern (fin portions 10b).

As shown in FIGS. 5(a) and 5(b), the upper portion of the PSZ baked film 13 is partially removed using a chemical that dissolves the PSZ baked film 13. At this time, the PSZ baked film 13 is removed such that it remains in a thickness of, for example, about 50 nm from the bottom surface of the trench 60 (the upper surface of the substrate portion 10a). This makes the upper surface of the PSZ baked film 13 lower than that of the SiO$_2$ film liner 12.

Note that, for example, an organic solvent, a diluted aqueous hydrofluoric acid solution, or a diluted aqueous phosphoric acid solution, which dissolve the PSZ baked film 13, is used as the chemical to remove the PSZ baked film 13. At this time, only the PSZ baked film 13 is removed, and the SiO$_2$ film liner 12 is not dissolved. Note that the PSZ baked film 13 may be planarized before removal.

As shown in FIGS. 6(a) and 6(b), the PSZ baked film 13 is nitrided and oxidized. PSZ is a material having a skeleton —SiH$_2$—NH—. For this reason, when PSZ is first annealed (nitrided) in nitrogen and then annealed (oxidized) in oxygen or steam, it can be converted into SiON. The PSZ baked film 13 is thus converted into an SiON film 13a.

It is preferable to perform the first nitrogen annealing at 700° C. or more and the second oxygen or steam annealing at 800° C. or more. However, the temperature is not limited to this. That is, annealing is performed at a temperature equal to or higher than the temperature for nitriding or oxidizing the PSZ baked film 13.

The concentration of nitrogen atoms in the SiON film 13a is preferably set to $10^{20}$ atoms/cm$^3$ or more by controlling the annealing temperature. This allows to make the etching rate of the SiON film 13a by the diluted hydrofluoric acid solution equal to or lower than that of the SiO$_2$ film liner 12 formed by thermal oxidation or CVD.

As shown in FIGS. 7(a) and 7(b), an SiO$_2$ film 14 is formed on the entire surface by, for example, CVD or a coating method using PSZ. That is, the SiO$_2$ film 14 is formed on the SiO$_2$ film liner 12 and the SiON film 13a. The Si pattern (fin portions 10b) is thus covered and buried completely. Note that in the coating method using PSZ, PSZ is coated, and steam annealing is then performed at 230° C. to 900° C. to oxidize the PSZ film, thereby forming the SiO$_2$ film 14.

As shown in FIGS. 8(a) and 8(b), the upper portion of the SiO$_2$ film 14 and the SiO$_2$ film liner 12 on the upper surface of the SiN film 11 are removed and planarized by a planarization process such as CMP (Chemical Mechanical Polishing). The upper surface of the SiN film 11 is thus exposed.

As shown in FIGS. 9(a) and 9(b), the SiO$_2$ film 14 and the SiO$_2$ film liner 12 are etched using a diluted hydrofluoric acid solution. With this process, the buried SiO$_2$ film 14 is removed. The SiO$_2$ film liner 12 on the side surfaces of the fin portion 10b and the upper surface of the SiN film 11 is also partially removed. At this time, the upper surface of the SiO$_2$ film liner 12 formed on the side surfaces of the fin portion 10b is adjusted to be almost flush with the upper surface of the SiON film 13a. At this time, the etching rate of the SiON film 13a by the diluted hydrofluoric acid solution is lower than that of the SiO$_2$ film liner 12. It is therefore possible to make the upper surface of the SiO$_2$ film liner 12 almost flush with the upper surface of the SiON film 13a.

Note that the upper surface of the SiO$_2$ film liner 12 formed on the side surfaces of the fin portion 10b may be lower than the upper surface of the SiON film 13a, as shown in FIG. 10. That is, the upper surface of the SiO$_2$ film liner 12 formed on the side surfaces of the fin portion 10b is adjusted to be lower than the upper surface of the SiON film 13a. Note that FIG. 10 is a sectional view of the source/drain regions taken along the line A-A in FIG. 1(b). At this time, the section of the channel region taken along the line B-B in FIG. 1(b) also has the same structure.

As shown in FIGS. 9(a) and 9(b) or FIG. 10, an impurity is introduced into the SiO$_2$ film liner 12 and the SiON film 13a by a known ion implantation method, and the impurity ions are diffused in the fin portions 10b. The heavily doped semiconductor layer 40 functioning as a punch-through stopper is formed in the fin portions 10b.

At this time, when the semiconductor substrate 10 (fin portion 10b) is of p-type, arsenic or the like is ion-implanted. On the other hand, for n-type, boron or the like is ion-implanted. The angle of ion implantation is 90° with respect to the upper surface of the semiconductor substrate 10 (the SiO$_2$ film liner 12 and the SiON film 13a). However, the angle is not limited to this and may be slightly shifted depending on the manufacturing apparatus and the like. More specifically, the angle need only prohibit many impurity ions from being directly implanted from the side surfaces of the fin portion 10b.

In this embodiment, the upper surface of the SiO$_2$ film liner 12 in contact with each side surface of the fin portion 10b is lower than the upper surface of the SiON film 13a formed on the side surfaces of the SiO$_2$ film liner 12. Thus controlling the height of the surface (upper surface) of the STI 30 in contact with the fin portion 10b makes it possible to reduce the range of the impurity ion concentration distribution in the fin portion 10b. This allows to increase the impurity ion density in the heavily doped semiconductor layer 40 and strengthen the function as the punch-through stopper.

Note that annealing may then be done to remove crystal defects and electrically activate the implanted ions.

Next, as shown in FIGS. 11(a) and 11(b), the SiN film 11 is removed using an aqueous phosphoric acid solution.

As shown in FIGS. 12(a) and 12(b), a gate insulating film (not shown) is formed on the upper and side surfaces of the fin portions 10b by, for example, CVD. After that, an electrode material is formed on the entire surface as a prospective gate electrode 15 by, for example, CVD. A conventionally known electrode material such as polysilicon, a metal such as W, Ru, or Co, or an alloy thereof is used. A stacked structure may be formed by combining various kinds of materials.

An SiN film 16 serving as a mask is formed on the electrode material by, for example, sputtering or CVD. The film thickness of the SiN film 16 is, for example, about 50 to 200 nm.

As shown in FIG. 13(a), the electrode material in the source/drain regions is removed by lithography and dry etching using the SiN film 16 as a mask. The upper portion of each fin portion 10b is thus exposed, and the upper surface of the STI 30 (the SiO$_2$ film liner 12 and the SiON film 13a) is exposed in the source/drain regions.

On the other hand, the electrode material remains in the channel region, as shown in FIG. 13(b). In the channel region, the gate electrode 15 is formed to cover the upper portion of each fin portion 10b via the gate insulating film (not shown). In other words, the gate electrode 15 is formed to cover the upper and side surfaces of the fin portions 10b.

As shown in FIG. 14(a), an SiN film liner 17 is formed on the exposed surfaces of the fin portions 10b and the STI 30 in the source/drain regions by sputtering or CVD. That is, the SiN film liner 17 is formed on the upper and side surfaces of the fin portions 10b and the upper surface of the STI 30 (the SiO₂ film liner 12 and the SiON film 13a). The film thickness of the SiN film liner 17 is, for example, 2 to 30 nm. At this time, the film formation process is preferably adjusted to increase the film thickness of the SiN film liner 17 formed on the exposed lower side surfaces of the fin portion 10b.

As shown in FIG. 15(a), the SiN film liner 17 is etched in the source/drain regions. The SiN film liner 17 on the upper surface of the STI 30 and the SiN film liner 17 on the upper surface and the upper side surfaces of each fin portion 10b are thus removed in the source/drain regions. That is, the SiN film liner 17 remains only on each side surface on the lower side (the side of the SiO₂ film liner 12) of the fin portions 10b, and the upper portion of the fin portion 10b is exposed. At this time, the SiN film 16 can also partially be removed in the channel region, as shown in FIG. 15(b).

As shown in FIG. 16(a), an Si film 18 is epitaxially grown on the exposed surface of each fin portion 10b in the source/drain regions. That is, the Si film 18 is formed on the upper surface and the upper side surfaces of the fin portion 10b.

As shown in FIG. 17(a), a metal film 19 is deposited on the entire surface in the source/drain regions. That is, the metal film 19 is formed on the upper and side surfaces of the Si film 18 and the upper surface of the STI 30. The metal film 19 is made of, for example, Co or Ni. However, the metal material is not limited to this and need only form a silicide with Si. At this time, the metal film 19 is also formed on the upper surface of the SiN film 16 in the channel region, as shown in FIG. 17(b).

After that, as shown in FIG. 2(a), annealing is performed at, for example, 300° C. to 500° C. for several ten min to silicidize the upper portion of each fin portion 10b, the Si film 18, and the metal film 19 in the source/drain regions, thereby forming a silicide film 20. A FUSI electrode is thus formed in the source/drain regions. After that, the metal film 19 except that on the fin portions 10b is removed.

The Fin-FET according to this embodiment is thus completed.

[Effects]

According to this embodiment, in the Fin-FET, the SiO₂ film liner 12 is formed on the surface of each fin portion 10b as the STI 30 between the elements. After that, the PSZ baked film 13 is buried by an application method and nitrided and oxidized to form the SiON film 13a. This allows to control the etching selectivity between the SiO₂ film liner 12 and the SiON film 13a in the subsequent etching process so as to form a desired STI structure. More specifically, the following effects can be obtained.

Figure 18:
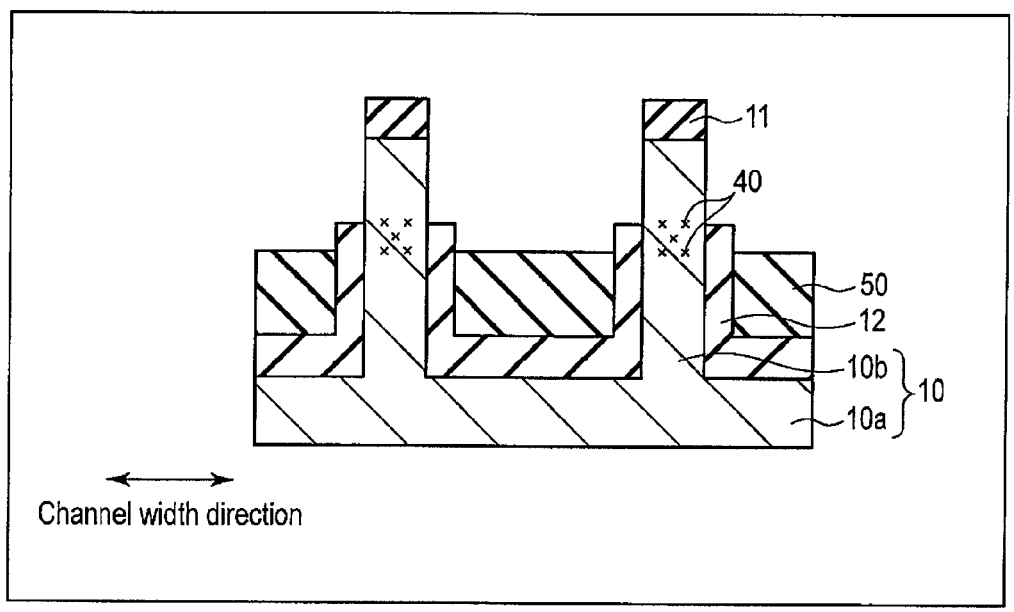
FIG. 18 is a sectional view showing a comparative example of the step in the manufacture of the Fin-FET according to the embodiment.

Normally, as shown by the comparative example of FIG. 18, an SiO₂ film 50 converted from a PSZ film by oxidation has a composition ratio different from that of the SiO₂ film liner 12 and therefore has a higher etching rate. For this reason, the upper surface of the SiO₂ film liner 12 in contact with each side surface of the fin portions 10b is higher than the upper surface of the SiO₂ film 50.

At the time of ion implantation in the fin portion 10b, first, impurity ions are implanted from the upper side to near the surface of the STI 30 in contact with the fin portion 10b. After that, the impurity ions are diffused and introduced into the fin portion 10b. In this way, the impurity ions are introduced into the region of the fin portion 10b at almost the same level as the surface of the STI 30.

At this time, when the upper surface of the SiO₂ film liner 12 in contact with each side surface of the fin portion 10b is higher than the upper surface of the SiO₂ film 50, as shown by the comparative example of FIG. 18, impurity ion diffusion into the fin portion 10b is difficult to control. More specifically, diffusion from near the surface of the SiO₂ film liner 12 and that from near the surface of the SiO₂ film 50 merge, and the region of the heavily doped semiconductor layer 40 spreads in the stacking direction. This makes the fin portion 10b have a wide impurity ion concentration distribution and a low density. It is therefore difficult to suppress current leakage from the fin portion 10b to the substrate portion 10a.

To the contrary, according to this embodiment, the upper surface of the SiO₂ film liner 12 in contact with each side surface of the fin portion 10b can be controlled to be equal to or lower than the upper surface of the SiON film 13a. This enables to form the heavily doped semiconductor layer 40 by diffusion only from near the surface of the SiO₂ film liner 12 upon ion implantation. It is therefore possible to make the fin portion 10b have a narrow impurity ion concentration distribution and a high density. As a result, current leakage from the fin portion 10b to the substrate portion 10a can be suppressed, and the device characteristics can be improved.

In addition, according to this embodiment, the STI 30 includes the SiON film 13a. That is, the STI 30 is highly durable as compared to the case in which the STI contains only SiO₂.

Application Example

An application example of the Fin-FET according to this embodiment will be described with reference to FIG. 19. The Fin-FET according to this embodiment is applicable as the peripheral circuit of various memories. That is, when the Fin-FET and various memory elements are connected, semiconductor memories having different functions can be formed.

Figure 19:
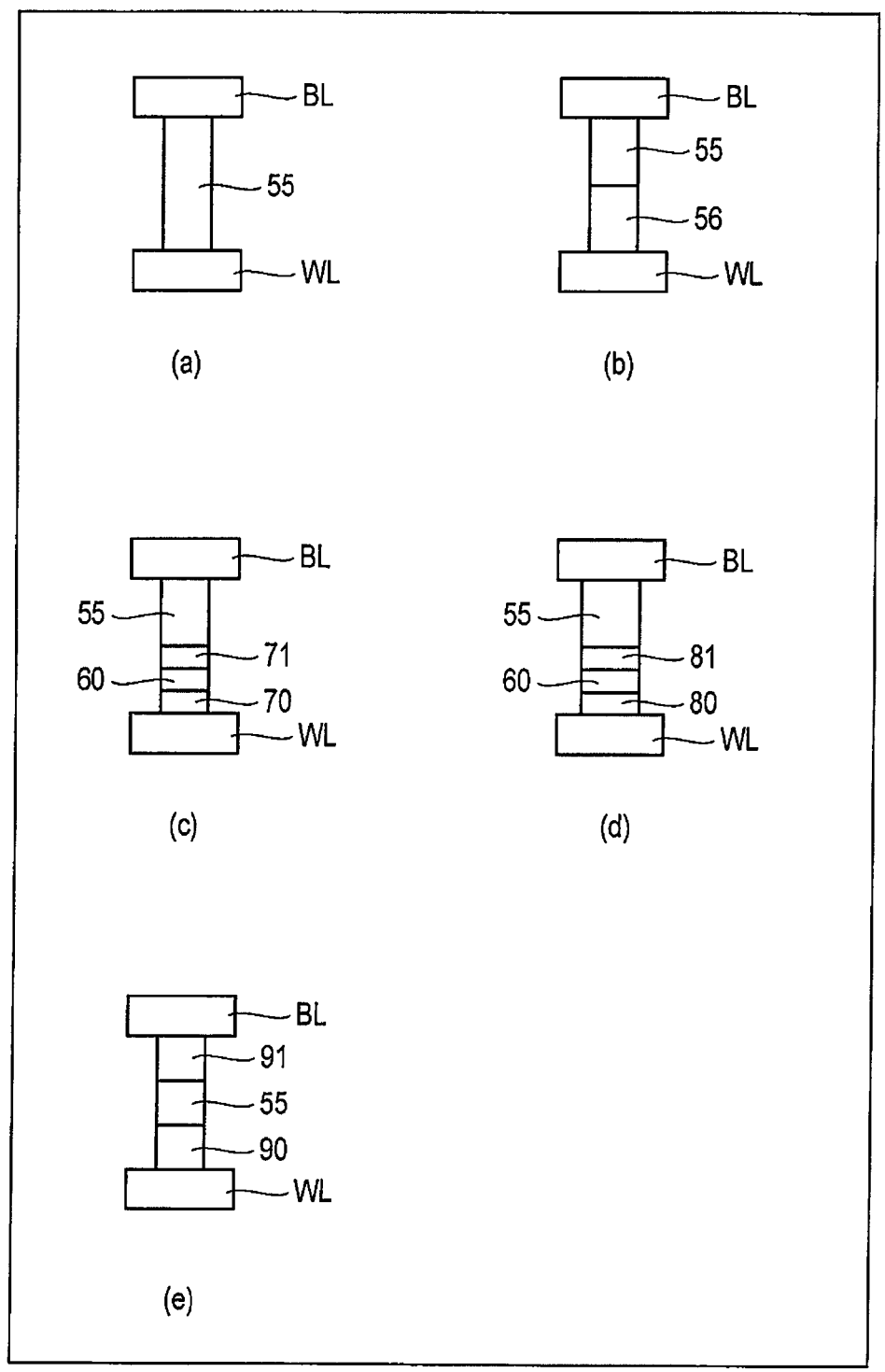
FIG. 19 is sectional views showing examples of the arrangement of a memory element to which the Fin-FET according to the embodiment is applied.

FIG. 19 is sectional views showing examples of the arrangement of a memory element to which the Fin-FET according to the embodiment is applied.

FIG. 19(a) shows a basic structure in which a memory element 55 is arranged between a word line WL and a bit line BL. The word line WL and the bit line BL are, for example, perpendicular to each other. That is, the memory element 55 has a so-called cross-point memory structure. Examples of the memory element 55 are a ferroelectric memory element, an MRAM memory element, a phase-change memory element, and a variable resistive element. These also apply to examples shown in FIGS. 19(b), 19(c), 19(d), and 19(e).

FIG. 19(b) shows an example in which a diode 56 is provided between the word line WL and the memory element 55. As the diode 56, a Schottky diode, a p-n junction diode, a PIN (or NIP) diode, or the like is usable.

FIG. 19(c) shows an example in which a metal layer 70, an insulating layer 60, and a metal layer 71 are provided between the word line WL and the memory element 55. More specifically, the metal layer 70, the insulating layer 60, and the metal layer 71 are sequentially stacked on the word line WL, and the memory element 55 is arranged on the metal layer 71.

Note that as the conductive layers between the word line WL and the memory element 55, polysilicon layers 80 and 81 may be provided in place of the metal layers 70 and 71, as shown in FIG. 19(d).

FIG. 19(e) shows an example in which a lower electrode 90 is provided between the word line WL and the memory element 55, and an upper electrode 91 is provided between the bit line BL and the memory element 55. That is, the lower electrode 90, the memory element 55, and the upper electrode 91 are provided between the word line WL and the bit line BL sequentially from the side of the word line WL.

The Fin-FET according to this embodiment is connected to each of the memory elements shown in FIGS. 19(a), 19(b), 19(c), 19(d), and 19(e) via the word line WL or the bit line BL so as to be applicable as the peripheral circuit of the memory element.

Note that the memory element may combine at least two of the structures shown in FIGS. 19(a), 19(b), 19(c), 19(d), and 19(e).

The Fin-FET is applicable not only as the peripheral circuit of the above-described cross-point memory element structures but also as the peripheral circuit of a memory element having a normal NAND structure.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of manufacturing a semiconductor device comprising:
    forming, in a semiconductor substrate, a substrate portion and a fin portion on the substrate portion;
    forming a first silicon oxide film on each side surface of the fin portion;
    forming, on each side surface of the first silicon oxide film, a polysilazane film having an upper surface lower than an upper surface of the first silicon oxide film;
    converting the polysilazane film into a silicon oxynitride film by nitriding and oxidizing the polysilazane film;
    forming a second silicon oxide film on an entire surface to cover the fin portion;
    etching the first silicon oxide film and the second silicon oxide film to make the upper surface of the first silicon oxide film not higher than an upper surface of the silicon oxynitride film; and
    forming a heavily doped semiconductor layer in the fin portion.

2. The method of claim 1, wherein nitriding of the polysilazane film is done by annealing in nitrogen, and oxidation of the polysilazane film is done by annealing in one of oxygen and steam.

3. The method of claim 2, wherein the annealing in nitrogen is done at not less than 700° C., and the annealing in one of oxygen and steam is done at not less than 800° C.

4. The method of claim 1, wherein the etching of the first silicon oxide film and the second silicon oxide film is done using a diluted hydrofluoric acid solution.

5. The method of claim 1, wherein a concentration of nitrogen atoms in the silicon oxynitride film is not less than $10^{20}$ atoms/cm$^3$.

6. The method of claim 1, wherein the heavily doped semiconductor layer is formed to be substantially flush with the upper surface of the first silicon oxide film.

7. The method of claim 1, wherein the first silicon oxide film is formed by one of CVD and thermal oxidation.

8. The method of claim 1, wherein the polysilazane film is formed by coating and subsequent baking.

9. The method of claim 1, further comprising planarizing an upper side of the first silicon oxide film and the second silicon oxide film by CMP before the etching the first silicon oxide film and the second silicon oxide film.

10. The method of claim 1, wherein the heavily doped semiconductor layer is formed by ion-implanting an impurity into the fin portion.

11. The method of claim 10, wherein the semiconductor substrate is of p-type, and the impurity is arsenic.

12. The method of claim 10, wherein the semiconductor substrate is of n-type, and the impurity is boron.

13. The method of claim 10, further comprising annealing the heavily doped semiconductor layer after the ion implantation.

* * * * *